United States Patent
Burnett et al.

(10) Patent No.: US 7,352,631 B2
(45) Date of Patent: Apr. 1, 2008

(54) METHODS FOR PROGRAMMING A FLOATING BODY NONVOLATILE MEMORY

(75) Inventors: James D. Burnett, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 435 days.

(21) Appl. No.: 11/061,005

(22) Filed: Feb. 18, 2005

(65) Prior Publication Data
US 2006/0186457 A1 Aug. 24, 2006

(51) Int. Cl.
*G11C 11/34* (2006.01)

(52) U.S. Cl. ............... 365/185.24; 365/185.18; 365/185.28

(58) Field of Classification Search ............... 365/185.01–185.33
See application file for complete search history.

(56) References Cited

U.S. PATENT DOCUMENTS

| | | | |
|---|---|---|---|
| 5,578,865 A | 11/1996 | Vu et al. | |
| 5,691,552 A | 11/1997 | Oyama | |
| 6,049,484 A * | 4/2000 | Lee et al. | 365/185.29 |
| 6,313,487 B1 | 11/2001 | Kencke et al. | |
| 6,429,055 B2 | 8/2002 | Oh | |
| 6,495,887 B1 | 12/2002 | Krishnan et al. | |
| 6,548,356 B2 | 4/2003 | Lui et al. | |
| 6,614,694 B1 * | 9/2003 | Yeh et al. | 365/185.29 |
| 6,937,516 B2 * | 8/2005 | Fazan et al. | 365/185.14 |
| 6,969,662 B2 * | 11/2005 | Fazan et al. | 438/292 |
| 6,982,918 B2 * | 1/2006 | Fazan et al. | 365/222 |
| 7,170,807 B2 * | 1/2007 | Fazan et al. | 365/222 |
| 2006/0186456 A1 * | 8/2006 | Burnett et al. | 257/315 |

OTHER PUBLICATIONS

T. Ohno, M. Takahaski, A. Ohtaka, Y. Sakakibara, and T. Tsuchiya "Suppression of the Parasitic Bipolar Effect in Ultra-Thin-Film nMOSFETs/SIMOX by Ar ion Implantation into Source/Drain Regions" IEEE IEDM 1995, pp. 627-630.

M. Yoshimi, M. Terauchi, A. Murakoshi, M. Takahashi, K. Matsuzawa, N. Shigyo, and Y. Ushiku "Technology Trends of Silion-On-Insulator—Its Advantages and Problems to be Solved" IEEE IEDM 1994, pp. 429-432.

(Continued)

*Primary Examiner*—Anh Phung
*Assistant Examiner*—Alexander Sofocleous
(74) *Attorney, Agent, or Firm*—Robert L. King; James L. Clingan, Jr.; Ranjeev Singh

(57) ABSTRACT

A technique to speed up the programming of a non-volatile memory device that has a floating body actively removes holes from the floating body that have accumulated after performing hot carrier injection (HCI). The steps of HCI and active hole removal can be alternated until the programming is complete. The active hole removal is faster than passively allowing holes to be removed, which can take milliseconds. The active hole removal can be achieved by reducing the drain voltage to a negative voltage and reducing the gate voltage as well. This results in directly withdrawing the holes from the floating body to the drain. Alternatively, reducing the drain voltage while maintaining current flow stops impact ionization while sub channel current collects the holes. Further alternatively, applying a negative gate voltage causes electrons generated by band to band tunneling and impact ionization near the drain to recombine with holes.

18 Claims, 7 Drawing Sheets

OTHER PUBLICATIONS

A. Nishiyama, O. Arisumi, and M. Yoshimi "Suppression of the Floating-Body-Effect in Partially-Depleted SOI MOSFET's with SiGe Source Structure and its Mechanism" IEEE. Trans. Elec. Dev., vol. 44, No. 12, Dec. 1997, pp. 2187-2192.

J.H. Sim, C.H. Choi, and K. Kim "Elimination of Parasitic Bipolar-Induced Breakdown Effects in Ultra-Thin SOI MOSFET's Using Narrow-Bandgap-Source (NBS) Structure" IEEE TRans. Elec. Dev., vol. 42, No. 8, Aug. 1995, pp. 1495-1502.

Okhonin, S. et al.; "A Capacitor-Less IT DRAM Cell"; IEEE Electron Device Letters; Feb. 2002; pp. 85-87; vol. 23, No. 2; IEEE.

Date, Celisa K. et al.; "Suppression of the Floating-Body Effect Using SiGe Layers in Vertical Surrounding-Gate MOSFETs"; IEEE Transactions on Electron Devices; Dec. 2001; pp. 2684-2689; vol. 48, No. 12; IEEE.

Ohno, Terukazu et al.; "Suppression of Parasitic Bipolar Action in Ultra-Thin-Film Fully-Depleted CMOS/SIMOX Devices by Ar-Ion Implantation into Source/Drain Regions"; IEEE Transactions on Electron Devices; May 1998; pp. 1071-1076; vol. 45, No. 5; IEEE.

Yoshimi, Makoto et al.; "Suppression of the Floating-Body Effect in SOI MOSFET's by the Bandgap Engineering Method Using a $Si_{1-x}Ge_x$ Source Structure"; IEEE Transactions on Electron Devices; Mar. 1997; pp. 423-430; vol. 44, No. 3; IEEE.

\* cited by examiner

METHODS FOR PROGRAMMING A FLOATING BODY NONVOLATILE MEMORY

CROSS REFERENCE TO RELATED APPLICATION

This application is related to the following pending application:
(1) U.S. patent application Ser. No. 11/060,996 entitled "NVM Cell on SOI and Method of Manufacture" filed concurrently herewith and assigned to the assignee hereof.

FIELD OF THE INVENTION

This invention relates generally to semiconductor devices, and more specifically, to nonvolatile memory devices and methods of programming.

BACKGROUND OF THE INVENTION

Memory circuits are commonly manufactured using thousands of transistors to store data. Each of the transistors has a gate or control electrode and two current electrodes known as a source and a drain in metal oxide semiconductor (MOS) technology. The source and the drain typically reside in a well region formed in a substrate. The source and drain are adjacent to the gate which is commonly elevated above the source and drain. For NVM transistors, a storage layer is placed between the gate and an underlying body that separates the source and the drain. The body is characterized as having an upper portion that is depleted of either holes or electrons depending upon the conductivity type of the transistor. Unless a transistor is a fully depleted device, a portion of the body is not depleted. The storage layer may store either electrons or holes that modulate the threshold voltage of the memory device. The threshold voltage is the voltage at which the transistor begins to conduct electrons (NMOS) or holes (PMOS). Several methods exist in which electrons or holes may be placed onto the storage layer. For example, a technique known as "hot carrier injection" or HCI occurs when a high gate and a high drain bias is applied relative to the source. For NMOS, electrons go from the source to the drain. A high electric field exists at the drain as a result. The high electric field creates impact ionization which injects electrons to the storage layer and holes are created near and in the drain region.

The term "bulk device" is commonly used to refer to a transistor having a well region in which the source, drain and channel reside. A connection to the well region is used to bias the well region. In bulk devices, the holes that are being created form a current that comes out through the well electrode. However, in SOI in which a floating body exists there is no well contact and thus the holes build up in the body until they eventually recombine with electrons at the source, drain or body. For bulk NVM devices, the junctions typically have low mid-bandgap defect densities. As a result, if the same junction structures are used in SOI, the recombination time is very long compared to the operations (e.g. programming, reading, erasing, etc.) of the nonvolatile memory device. As used herein, recombination time refers to the time required for holes and electrons to be neutralized in charge. The long recombination time thus makes the threshold voltage of the memory device vary over time.

Another problem is that during the programming operation the holes may build up to such an extent that they do not allow the programming operation to function completely or to fail. This occurs due to two effects. A first effect is the reduction of the lateral electric field between the drain and the body of the NVM transistor cell. As the holes build up, the lateral electric field is reduced when the body potential rises while the drain potential is fixed. A second effect is the reduction of the vertical electric field between a storage medium and the body. As the holes build up, the vertical electric field is reduced when the body potential rises while the control gate potential is fixed.

Yet another problem for transistors with a floating body is that as the floating body bias becomes high, an inherent bipolar transistor inherent in any MOS transistor becomes conductive. The biasing of the inherent transistor may result in avalanche breakdown at the drain of the floating body device. A common symptom of this phenomena is ruptured gate oxides and thermal damage to the drain junction which permanently modifies desired electrical characteristics. These issues limit the usefulness of implementing NVM cells on SOI.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
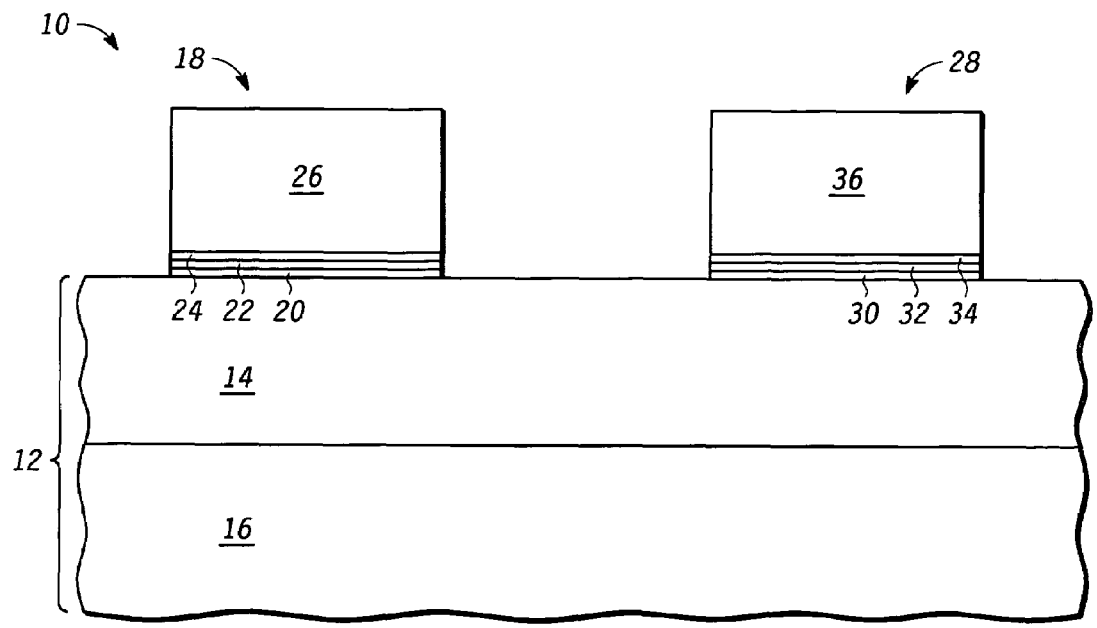
FIGS. 1-7 illustrate in cross-sectional form NVM transistor cells on SOI and a method for forming an NVM memory on SOI in accordance with one form of the present invention.

Illustrated in FIG. 1 is a semiconductor device 10 having an NVM (nonvolatile memory) cell 18 and an NVM cell 28. An insulator layer 16, commonly implemented as an oxide, is provided. Overlying the insulator layer 16 is a layer of silicon 14. Collectively, the layer of silicon 14 and insulator layer 16 is an SOI (silicon on insulator) substrate 12. In one form the layer of silicon is doped to have a P-type conductivity but it should be well understood that an opposite conductivity may be formed. NVM cell 18 has a tunnel dielectric 20 overlying the layer of silicon 14. Overlying the tunnel dielectric 20 is a charge storage layer 22. Overlying the charge storage layer 22 is a dielectric layer 24. Overlying the dielectric layer 24 is a gate 26. NVM cell 28 has a tunnel dielectric 30 overlying the layer of silicon 14. Overlying the tunnel dielectric 30 is a charge storage layer 32. Overlying the charge storage layer 32 is a dielectric layer 34. Overlying the dielectric layer 34 is a gate 36.

Various materials may be used for these structural features. For example, each of tunnel dielectric 20 and tunnel dielectric 30 may be implemented with silicon dioxide (oxide), nitrided oxide, hafnium oxide, other metal oxides and combinations thereof. Charge storage layer 22 and charge storage layer 32 may be a continuous polysilicon layer, a nitride layer, silicon nanoclusters or other semiconductor or insulator materials. Dielectric layer 24 and dielectric layer 34 may be implemented with oxide, silicon nitride and combinations thereof. These two layers are implemented with a dielectric material having a high dielectric constant to insulate the respective gate from the respective storage layer and to provide good capacitive coupling of the respective gate to the respective charge storage layer. It should again be noted that the proportion of the layers are not necessarily drawn to scale for purposes of illustration.

Figure 2:
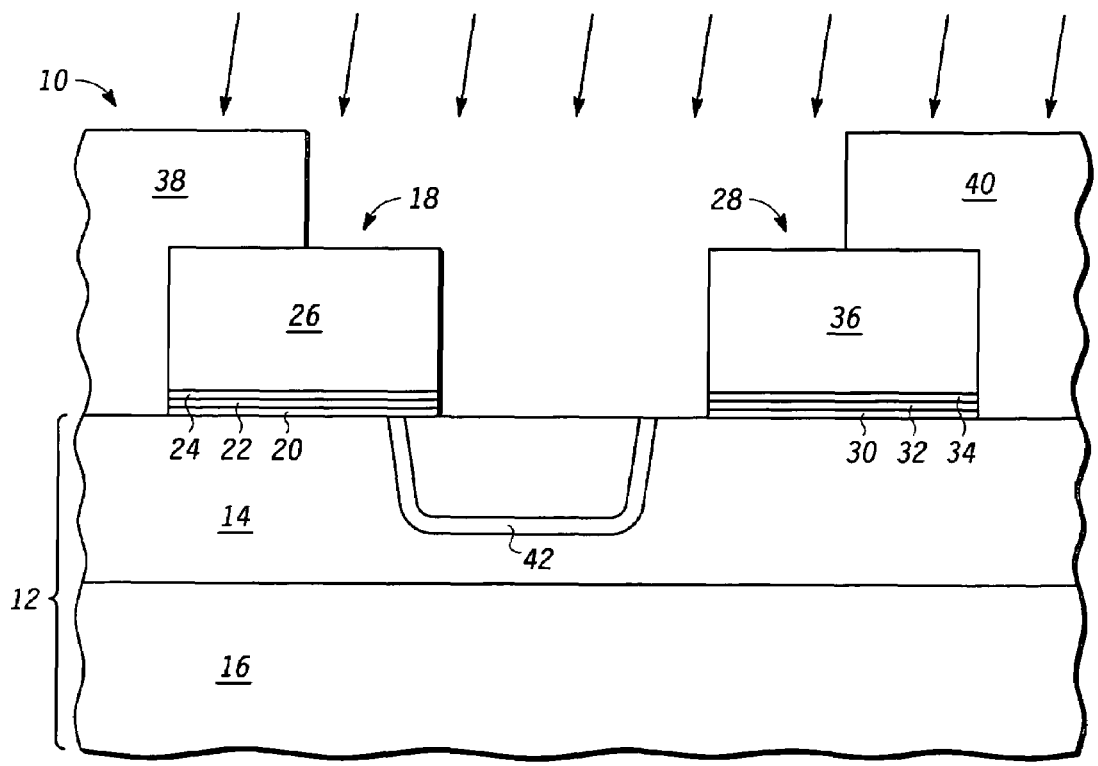

Illustrated in FIG. 2 is further processing of semiconductor device 10 of FIG. 1. In particular, a masking layer 38 and a masking layer 40 are provided. Masking layer 38 is formed overlying a portion of the NVM cell 18. In particular, masking layer 38 is formed overlying the portion of NVM cell 18 that will subsequently become the drain of the NVM cell 18. Masking layer 40 is formed overlying a portion of the NVM cell 28. In particular, masking layer 40 is formed overlying the portion of NVM cell 28 that will subsequently become the drain of the NVM cell 28. Various materials may be used for the masking layer 38 and masking layer 40. For example, a hard material mask, photoresist or other conventional masking materials may be used as the masking layer 38 and masking layer 40. Also, in FIG. 2 is an angled implant step indicated by the arrows. The implant is a neutral impurity implant. The result of the angled implant step is to form a deep level trap or recombination region 42. Recombination region 42 is a high density region of mid-bandgap defects which act as recombination centers. Recombination centers function to efficiently recombine excess electrons with holes and excess holes with electrons to thereby neutralize excess charges. The energy and tilt angle of the implant together with the dose are chosen to create a high amount of recombination centers at the source/body junction to be subsequently formed. A portion of the layer of silicon 14 underlying gate 26 will become the body of NVM cell 18. Similarly, a portion of the layer of silicon 14 underlying gate 36 will become the body of NVM cell 28. It should be noted that various tilt angles may be implemented depending upon other parameters of the devices and implant characteristics. Typical implant tilt angles vary between about ten degrees to fifty degrees, but other tilt angles may be appropriate. In one form, either an Ar or Xe implant may be used. However, other implant chemistries, such as Ge, may be implemented. Doses may vary significantly. As an example, doses within a range of approximately $1\times10^{14}$ per $cm^2$ to $1\times10^{15}$ per $cm^2$ may be used. However, other dosage ranges may be used depending upon the device characteristics and materials. Although in a preferred form an angled implant is used, it should be well understood that straight (i.e. no angled) implants may be used. In either embodiment, conventional implant equipment may be used.

It should be noted that the angled implant forms a "U"-shaped implant region. The implant strikes the upper surface of the layer of silicon 14 and continues through the layer of silicon 14 until an end of range area. The point of the end of range will vary depending upon a number of processing factors. As further implanting occurs, defects to the layer of silicon 14 are created at the end of range up to a certain thickness, at which point the damage terminates. The implanted area has a high density of mid-bandgap defects which act as recombination centers.

Figure 3:
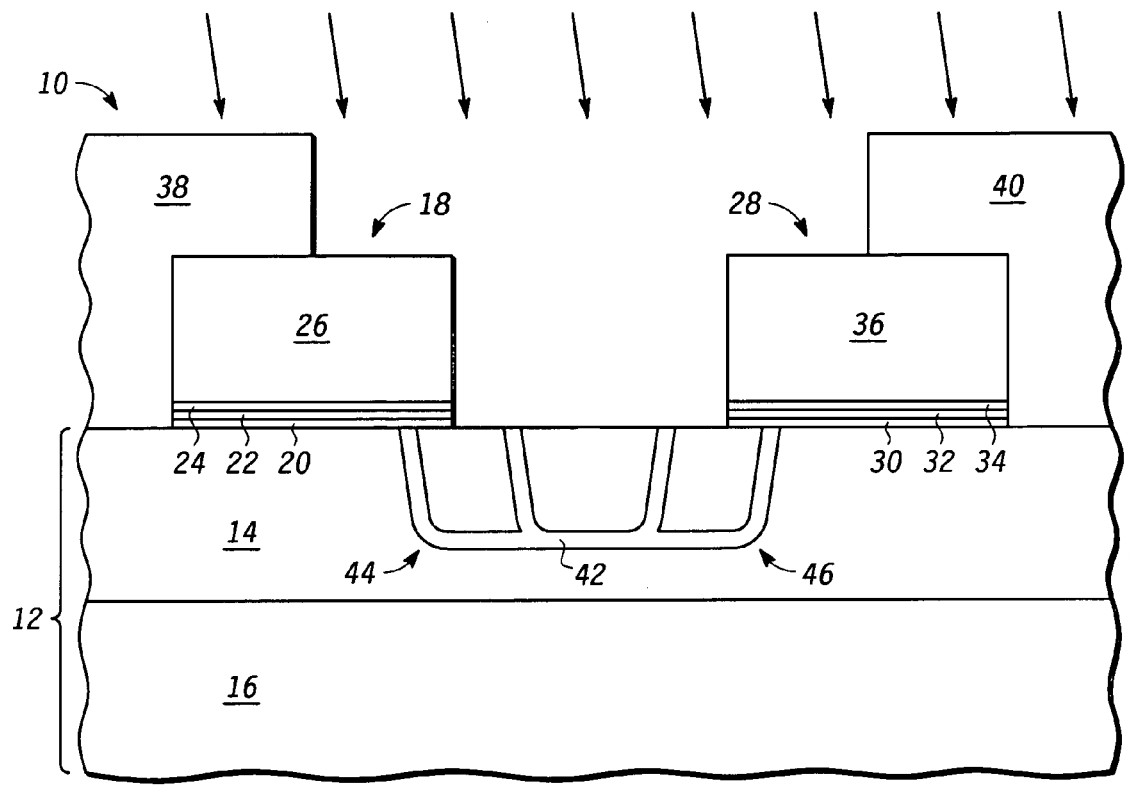

Illustrated in FIG. 3 is further processing of semiconductor device 10 of FIG. 1. In particular, masking layer 38 and masking layer 40 are again utilized. An angled implant step of semiconductor device 10 in a complementary angled direction is indicated by the arrows. As before, the implant is a neutral impurity implant. The result of the angled implant step is to additionally form a modified deep level trap or recombination region 42. Recombination region 42 is a high density region of mid-bandgap defects which act as recombination centers. Portion 46 of recombination region 42 is positioned to be adjacent to the source of NVM cell 28 to be formed subsequently. Portion 44 of recombination region 42 is positioned to be adjacent of the source of NVM cell 18 to be formed subsequently. As above, recombination centers function to recombine excess electrons with holes and excess holes with electrons to thereby neutralize excess charges. As with the first angled implant of FIG. 2, the energy and tilt angle of the implant together with the dose are chosen to create a high amount of recombination centers at the source/body junction to be subsequently formed.

Figure 4:
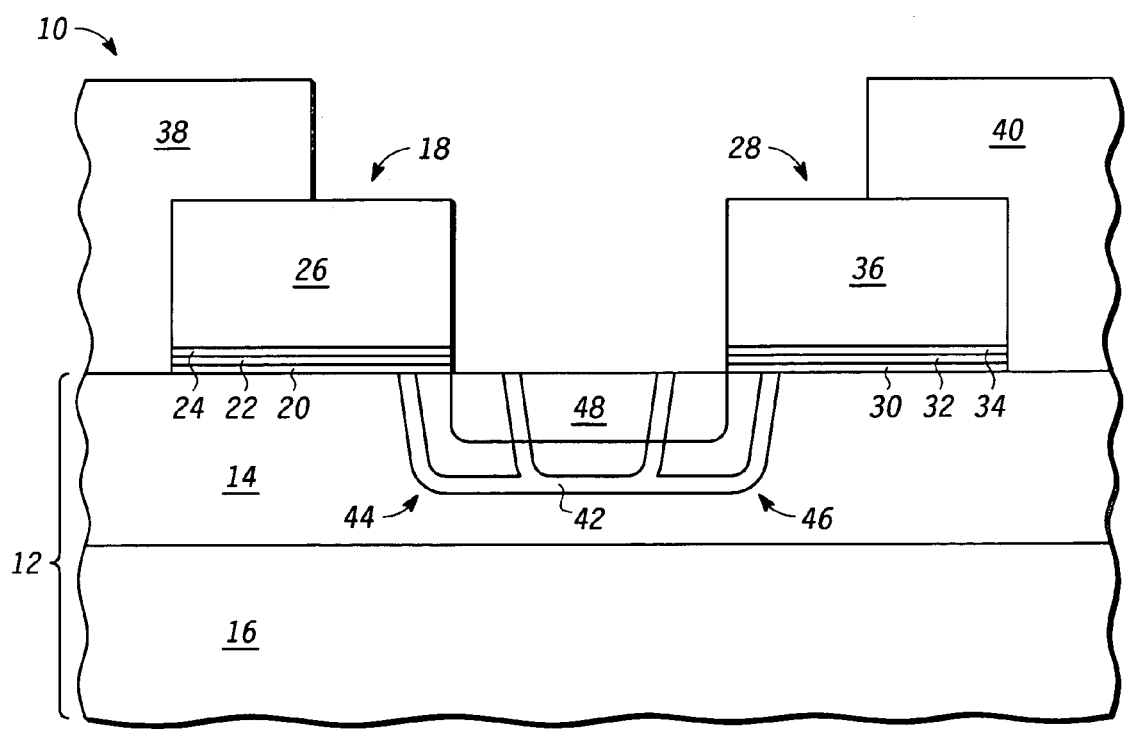

Illustrated in FIG. 4 is further processing of semiconductor device 10 wherein a source extension region 48 is formed. The source extension region 48 is formed by a conventional implant step (not shown). The implant species, in one form, is arsenic, As, for an NMOS device and BF2 for a PMOS device. Other implant species may be used consistent with an N-type species being used for an NMOS transistor and a P-type species being used for a PMOS transistor. During this sequence of processing steps, an optional conventional halo step (not shown) may be used to provide additional doping adjacent to the source extension region 48. Annealing of the device may be optionally implemented. If annealing occurs, the shape of recombination region 42 may be modified somewhat from that shown in FIG. 3. Sidewall spacers (not shown) adjacent gate 26 and gate 36 may be implemented to modify the width of the source extension region 48. The source extension region 48 will be further processed to form a source for each of NVM cell 18 and NVM cell 28.

Figure 5:
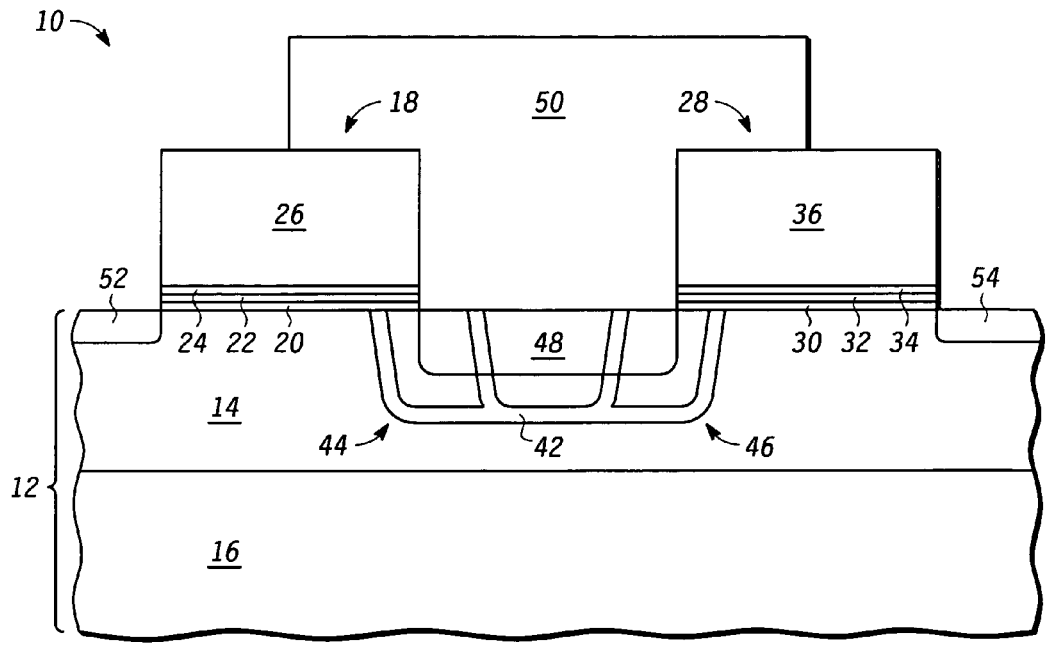

Illustrated in FIG. 5 is further processing of semiconductor device 10. Masking layer 38 and masking layer 40 have been removed. A mask 50 is formed overlying the source extension region of each of NVM cell 18 and NVM cell 28. Additionally, mask 50 is formed overlying a portion of each of gate 26 and gate 36. A conventional implant is performed to form a drain extension region 52 of NVM cell 18 and a drain extension region 54 of NVM cell 28. It should be understood that optional processing steps (not shown) may be implemented. For example, conventional sidewall spacers may be formed adjacent gates 26 and 36 to modify the width of the drain extension region 52 and drain extension region 54. An optional conventional halo step (not shown) may be used to provide additional doping adjacent to the drain extension region 52 and drain extension region 54. Annealing of the device may be optionally implemented. If annealing occurs, the shape of recombination region 42 may be modified somewhat from that shown in either FIG. 3 or FIG. 4.

Figure 6:
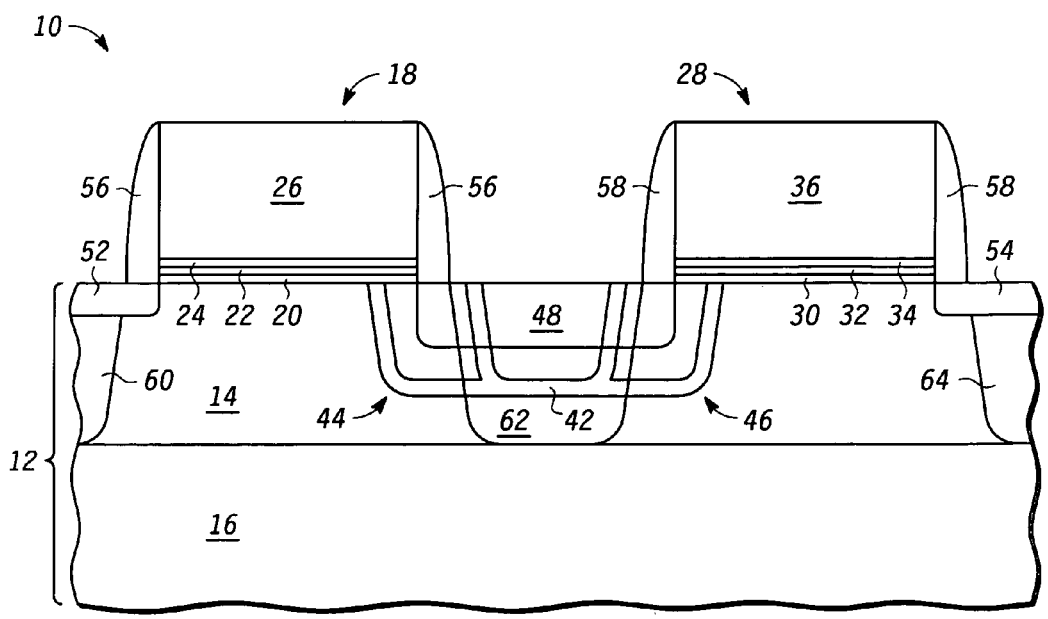

Illustrated in FIG. 6 is further processing of semiconductor device 10. Conventional sidewall spacers are formed adjacent the composite gate stack of each of NVM cell 18 and NVM cell 28. For NVM cell 18, a sidewall spacer 56 is formed, and for NVM cell 28, a sidewall spacer 58 is formed. A deep source/drain conventional implant is implemented. The deep source/drain conventional implant forms deep source/drain regions 60, 62 and 64. Regions 60 and 64 function as the drain of NVM cell 18 and NVM cell 28, respectively. Region 62 functions as the source of each of NVM cell 18 and NVM cell 28. Regions 60, 62 and 64 have an N-type conductivity for NMOS devices and may be, by way of example only, arsenic or phosphorous. Regions 60, 62 and 64 have a P-type conductivity for PMOS devices and may be, by way of example only, boron or $BF_2$. At this point in the illustrated form, the shape and position of recombination region 42 with portions 44 and 46 remains the same as initially implanted, but may vary depending upon processing temperatures used up to this point.

Figure 7:
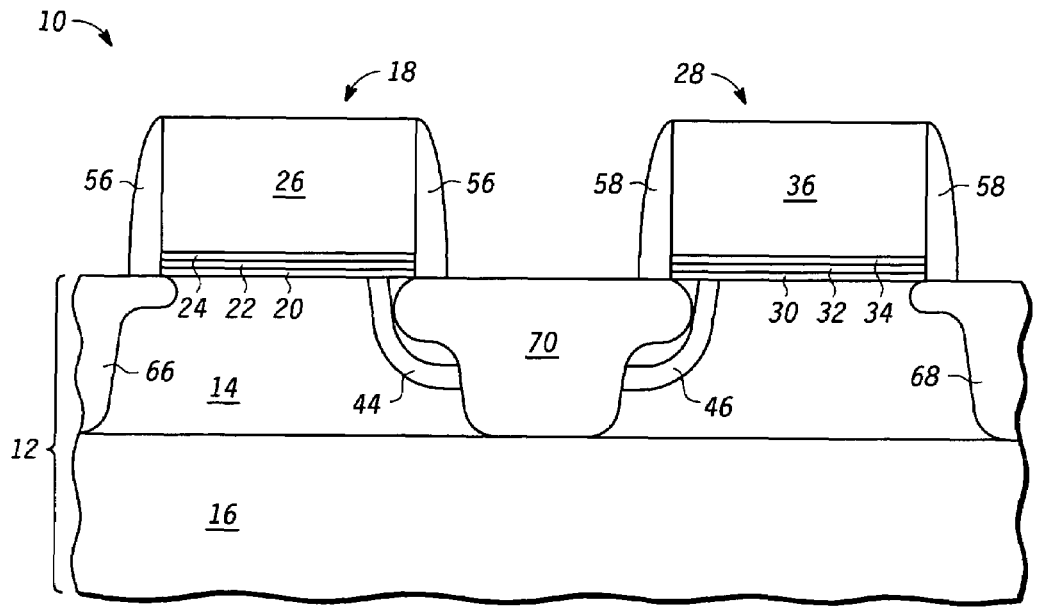

Illustrated in FIG. 7 is further processing of semiconductor device 10. Region 48 and 62 form, when subjected to annealing, a common source region 70 for each of NVM cell 18 and NVM cell 28. For NMOS implementations, the conductivity of the common source region 70 is N-type and for PMOS implementations the conductivity of the common source region 70 is P-type. Portion 44 is a region of recombination centers that is outside of common source region 70 and adjacent to common source region 70 underneath gate 26. Portion 46 is a region of recombination centers that is outside of common source region 70 and adjacent to common source region 70 underneath gate 36. A drain 66 of NVM cell 18 is a composite of deep source/drain region 60 and drain extension region 52. A drain 68 of NVM cell 28 is a composite of deep source/drain region 64 and drain extension region 54. It should be noted that only the source of each NVM cell has an adjoining electron-hole recombination region. This asymmetry functions to enhance the programming speed and other memory operations of the NVM cell 18 and NVM cell 28. Additionally, the illustrated NVM cell structure minimizes negative effects associated with excess charge build-up in the body portion of the layer of silicon 14 for NVM cells on SOI. Again, excess charge build-up is minimized in the body due to efficient recombination provided by portions 44 and 46 of recombination region 42. By not having a high density of recombination centers at the drain, an efficient large-scale implementation may be realized.

In the illustrated form of FIG. 7, assume that N-channel devices are implemented. As a result, the drain regions 66 and 68 are connected to a positive voltage potential relative to the common source region 70. Any excess holes in the body portion of the layer of silicon 14 will recombine at the source/body interface where portion 44 is positioned for NVM cell 18. Therefore, the potential of the body region of NVM cell 18 is maintained close to the potential of common source region 70. This voltage relationship minimizes variation of threshold voltage. Thus, the change in threshold voltage $V_t$ obtained by storing electrons in the storage layer is not offset by holes stored in the body. This voltage relationship also enables the HCI programming to be more efficient by maintaining a high higher voltage potential between the drain and the body which also results in a higher lateral electric field between the drain and the body. This voltage relationship helps prevent the inherent bipolar transistor (e.g. drain 66 being the collector, the body portion of the layer of silicon 14 being the base and the common source region 70 being the emitter) of every transistor, such as NVM cell 18, from being strongly turned on and damaging the drain with a high current.

At this point it should be appreciated that there has been provided an improved NVM cell for storing data as a memory. The structures described herein may be used for all types of charge storage transistor structures implemented in SOI. In one form the non-volatile memory (NVM) device has a semiconductor-on-insulator (SOI) substrate having a semiconductor portion and an insulator portion under the semiconductor portion. A gate overlies the SOI substrate. A storage layer is between the gate and the SOI substrate. A drain region is in the semiconductor portion on one side of the gate and a source region is in the semiconductor portion on an opposite side of the gate. A first region is in the semiconductor portion and under a portion of the drain region, wherein the first region has a first average defect density between the drain region and the insulator portion. A second region is in the semiconductor portion and under a portion of the source region. The second region has a second average defect density between the source region and the insulating portion that is at least one hundred times greater than the first average defect density. In one form the semiconductor portion is monocrystalline silicon and the second region has neutral impurities of at least one of the group of argon, xenon, and germanium. In another form the second region contacts the source region. The NVM device has a body between the source and drain regions, wherein the second region extends into the body. The NVM device also has a tunnel dielectric layer between the storage layer and the semiconductor portion. In one form the storage layer is formed from polysilicon, nanocrystals (i.e. nanoclusters) or silicon nitride or a combination thereof. The second region functions as an electron/hole recombination region during programming of the NVM device. There is also provided a method of making a non-volatile memory (NVM) device on a semiconductor-on-silicon (SOI) substrate having a semiconductor portion on an insulator portion. A gate stack is formed over the semiconductor portion, the gate stack having a control gate and a storage layer. The storage layer is between the control gate and the semiconductor portion. A drain side of the gate stack is masked to leave open a source side of the gate stack. While masking the drain side, neutral impurities are implanted into the semiconductor portion in the source side. At least a portion of the impurities reside at a first depth, wherein the defect density at the first depth is increased by at least a factor of one hundred. The source side is implanted with first acceptor/donor impurities to a second depth, wherein the first depth is closer to the insulator portion than the second depth. The drain region is implanted with the first acceptor/donor species. The gate stack further includes a tunnel dielectric disposed between the semiconductor portion and the storage layer. The implanting of neutral impurities is performed at an angle relative to vertical so as to obtain some impurities under the gate. The angle of implant relative to vertical is at least 10 degrees but less than 45 degrees. The drain side is unmasked after the implanting the source side with acceptor/donor impurities. The drain side is unmasked prior to implanting the source side with acceptor/donor impurities. There is also provided method of making a non-volatile memory (NVM) device in which a semiconductor-on-insulator (SOI) substrate is provided having a semiconductor portion and an insulator portion under the semiconductor portion. A gate over the SOI substrate is provided. A storage layer between the gate and the SOI substrate is provided. The semiconductor portion is masked on a drain side of the gate. While masking the semiconductor portion, neutral impurities are implanted into a source side of the gate to form an electron/hole recombination region. Implanting of neutral impurities is performed at an angle with respect to vertical so that the electron/hole recombination region extends under the gate. A source region is formed in the source side that has a lightly-doped portion and a heavily doped portion wherein at least a portion of the lightly-doped portion is over at least a portion of the electron/hole recombination region. The electron/hole recombination region contacts the source region. In one form the neutral impurities are germanium, xenon or argon.

Figure 8:
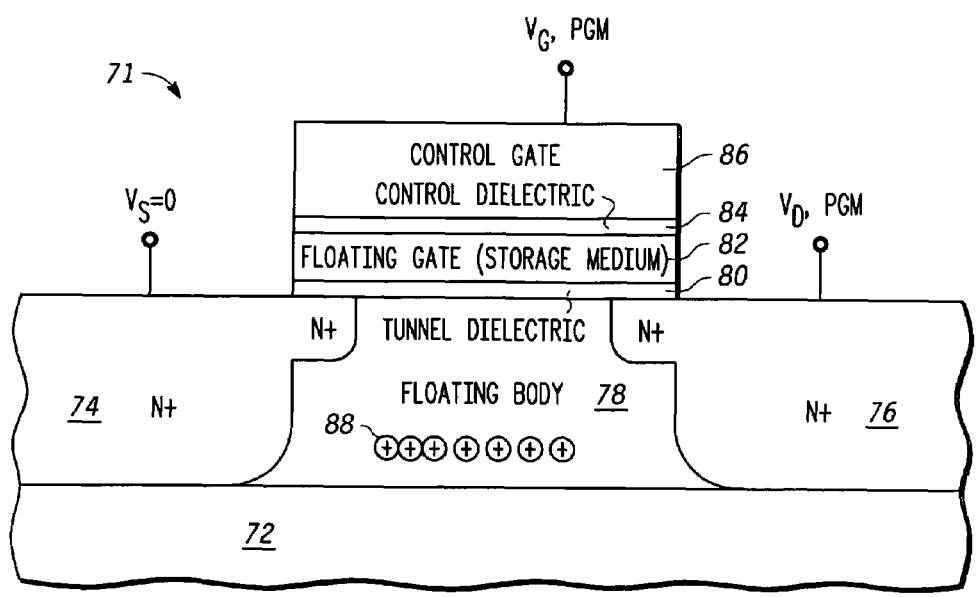
FIG. 8 illustrates in cross-sectional form an NVM transistor cell on SOI having connections for programming in accordance with the present invention.

Illustrated in FIG. 8 is a cross-section of an NVM transistor 71 in an integrated circuit. An insulating layer 72 is provided. The insulating layer 72 may be of any dielectric material. A commonly used material for insulating layer 72 is silicon dioxide. Overlying insulating layer 72 is a source 74, a floating body 78 and a drain 76. Source 74 and drain 76 are each formed of N+ conductivity in the illustrated form. Each of source 74, drain 76 and body 78 may be implemented with a variety of semiconductor materials. A common semiconductor material for source 74 and drain 76 is silicon. Overlying the floating body 78 is a tunnel dielectric layer 80. The tunnel dielectric layer 80 may be formed of any insulating material. In one form tunnel dielectric layer 80 is silicon dioxide or a nitrided form thereof. Overlying the tunnel dielectric layer 80 is a storage medium 82. The storage medium 82 functions as a floating gate electrode in the illustrated form and may be implemented with any of numerous materials having a storage characteristic. For example, polysilicon, silicon nitride, silicon nanoclusters, germanium and other known materials that have a storage characteristic may be used for storage medium 82. Overlying the storage medium 82 is a control dielectric layer 84. The control dielectric layer 84 is formed of any dielectric material. In one form the control dielectric layer 84 is implemented as a conventional oxide/nitride/oxide film (ONO). Overlying the control dielectric layer 84 is a control gate 86 which is connected to a terminal for applying a gate program voltage labeled $V_G$, PGM. A terminal for applying a source voltage labeled $V_S$ is connected to the source 74, and a terminal for applying a drain program voltage labeled $V_D$, PGM is connected to the drain 76.

In the illustrated form, the biasing of the drain 76 and the control gate 86 results in an area having a depletion of holes. This depletion of holes occurs immediately below the control gate 86 in the channel region (not numbered) between the source 74 and the drain 76. The holes that result from impact ionization that occurs during a programming operation concentrate at the lower portion of the body 78 and is illustrated by a number of holes 88.

Figure 9:
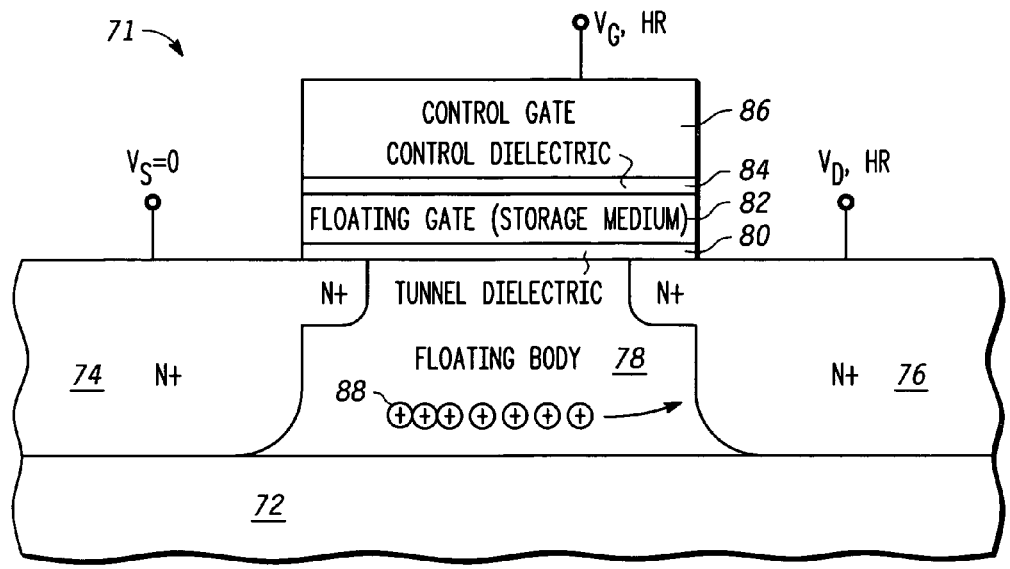
FIG. 9 illustrates in cross-sectional form an NVM transistor cell on SOI having connections for hole removal from the floating body in accordance with the present invention.

Illustrated in FIG. 9 is NVM transistor 71 wherein the gate program voltage has been changed to a hole reduction (HR) gate voltage labeled $V_G$, HR. Additionally, the drain program voltage has been changed to a hole reduction voltage $V_D$, HR. These two voltages are selected so that holes in the lower portion of the floating body 78 are injected into the drain 76 where the holes recombine with electrons.

Figure 10:
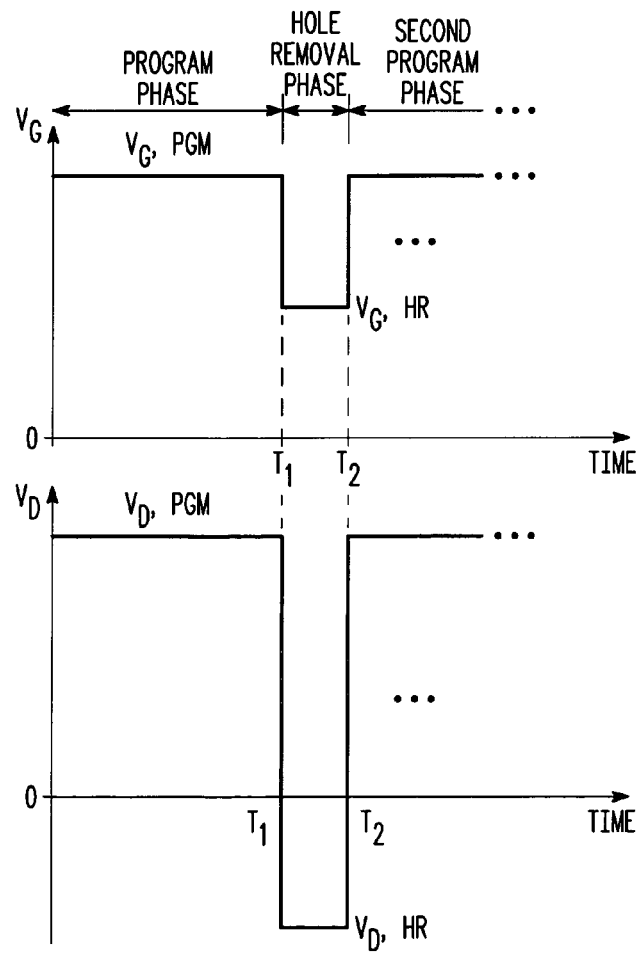
FIG. 10 illustrates in graphical form successive program and hole removal phases of the NVM transistor cell of FIGS. 8 and 9 in accordance with a first programming embodiment.

To understand the operation of NVM transistor 71, reference will be made to the voltage signals of FIG. 10. Illustrated in FIG. 10 are graphs of the gate voltage $V_G$ and the drain voltage $V_D$ versus time. The programming of NVM transistor 71 involves both a program phase and a hole removal phase which are repeated a predetermined number of times as indicated by the dots in FIG. 10. During a first program phase, a gate program voltage $V_G$, PGM is applied to the control gate 86 while a drain voltage $V_D$, PGM is applied to the drain 76. The gate program voltage $V_G$, PGM typically has a value of about seven to nine volts, but other voltages may be used. The drain program voltage $V_D$, PGM typically has a value of about four to five volts, but other voltages may be used. The program phase lasts a predetermined time long enough to begin injection of electrons from the floating body 78 and drain 76 interface region onto the storage medium 82. During the program phase, holes such as holes 88 begin to build up in the floating body as a result of the impact ionization in the high lateral field region within the interface region between the floating body 78 and the drain 76. The holes 88 are very undesirable. For example, the presence of holes 88 changes the electrical characteristics of floating body 78 resulting in a variable threshold voltage for NVM transistor 71 and may result in the failure to complete the program operation.

At time T1 the program phase is terminated by changing the value of the gate voltage and the drain voltage. In particular, a hole removal phase exists after the program phase between time T1 and time T2. During the hole removal phase a $V_G$, HR gate voltage is applied which is substantially lower than the immediately preceding gate program voltage $V_G$, PGM. For example, a $V_G$, HR gate voltage of somewhere in the range of two to four volts may be applied. However, it should be well understood that other voltage ranges may be implemented. At the same time a negative drain voltage labeled $V_D$, HR is applied to the drain 76. In one form the value of $V_D$, HR is in the range of negative one to negative three volts. It should be similarly understood that other voltage ranges may be implemented. During the hole removal phase, the holes 88 are injected toward the drain 76 resulting from a forward biasing of the floating body 78-to-drain 76 junction due to the negative voltage that is applied to the drain 76 together with the positive voltage that is applied to the control gate 86. As the holes are pulled toward the floating body/drain interface in the lower half of floating body 78 and into drain 76, recombination occurs and the holes are reduced from the floating body 78. While many holes are actively removed, it should be understood that not all holes are necessarily removed during the first and subsequent hole removal phases. However, a significant reduction in the number of holes within the floating body 78 occurs to minimize the threshold voltage variation of NVM transistor 71 and to improve the program efficiency. To improve the amount of hole removal, a plurality of successive program phases and hole removal phases may be implemented as indicated in FIG. 10 by the beginning of a second program phase and three dots successive dots. In other words a series of sequential program and hole removal phases may be implemented. Any number of repetitions of program and hole removal phases may be implemented. In one form, the number may be in the range of three to ten, at which point a verification operation of the resulting threshold voltage is performed. If the threshold voltage is sufficiently high, the program operation is ended. Other numbers of repetitions may be implemented depending upon the particular application. It should be noted that the voltage values during the hole removal phase for $V_G$ and $V_D$ are carefully selected. In particular, the values of $V_G$, HR and $V_D$, HR are selected to have a minimal amount of impact ionization such that the hole removal rate to the drain is much greater than the hole creation rate from impact ionization during the hole removal phase.

Figure 11:
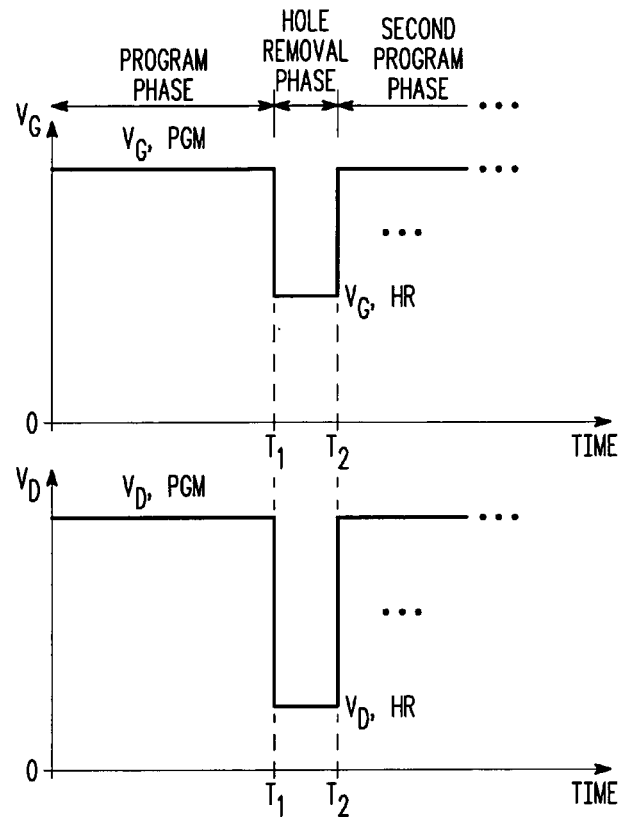
FIG. 11 illustrates in graphical form successive program and hole removal phases of an NVM transistor cell in accordance with another programming embodiment.
Figure 12:
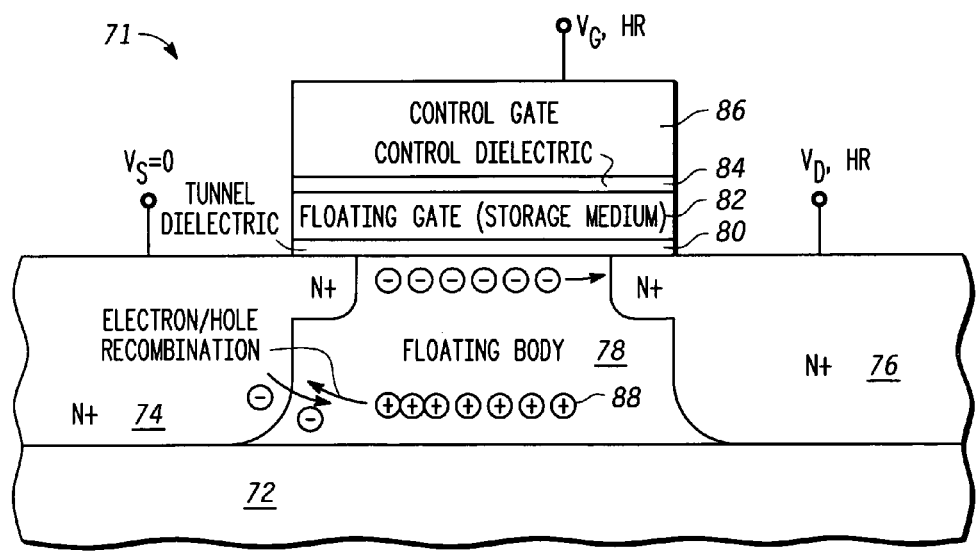
FIG. 12 illustrates in cross-sectional form an NVM transistor cell on SOI for use with the programming embodiment of FIG. 11.

Illustrated in FIG. 11 is yet another programming embodiment which will be explained in combination with the cross-sectional view of NVM transistor 71 of FIG. 12. As before, during a first program phase, a gate program voltage $V_G$, PGM is applied to the control gate 86 while a drain voltage $V_D$, PGM is applied to the drain 76. As before, the program phase lasts a predetermined time which is long enough to begin injection of electrons from the floating body 78 and drain 76 interface region onto the storage medium 82. Holes 88 again begin to build up in the floating body as a result of the impact ionization in the high lateral field region within the interface region between the floating body 78 and the drain 76.

At time T1 the program phase is terminated by changing the value of the gate voltage and the drain voltage and the hole removal phase is entered. During the hole removal phase a $V_G$, HR gate voltage is applied which again is substantially lower than the immediately preceding gate program voltage $V_G$, PGM. For example, a $V_G$, HR gate voltage of somewhere in the range of three to five volts may be applied. However, it should be well understood that other voltage ranges may be implemented. At the same time a positive drain voltage labeled $V_D$, HR is applied to the drain 76 which is substantially lower than the immediately preceding drain program voltage $V_D$, PGM. In one form the value of $V_D$, HR is in the range of one to three volts. It should be similarly understood that other voltage ranges may be implemented. During the hole removal phase, the holes 88 are injected toward the source 74 resulting from a forward biasing of the floating body 78-to-source 74 junction due to the positive voltage that is applied to the drain 76 together with the positive voltage that is applied to the control gate 86. As the holes are pulled toward the floating body/source interface in the lower half of floating body 78 and into source 74, recombination occurs and the holes are reduced from the floating body 78. Also, holes can recombine with electrons in the floating body 78. The electrons can be injected from the source 74 into the floating body 78 as a diode current or as a subchannel current that flows to the drain 76. Depending upon the voltage biasing, the source 74 and floating body 78 junction may be forwarded biased to permit significant electron flow. Electrons can also flow from the source 74 through the floating body 78 to the drain 76 as a subchannel current at the lower portion of the floating body where some can recombine with holes 88. While many holes are removed, it should be understood that not all holes are necessarily removed. However, a significant reduction in the number of holes within the floating body 78 occurs to minimize the threshold voltage variation of NVM transistor 71 and to improve the programming efficiency. To improve the amount of hole removal, a plurality of successive program phases and hole removal phases may be implemented as indicated in FIG. 11 by the beginning of a second program phase and three dots successive dots. In other words a series of sequential program and hole removal phases may be implemented. Any number of repetitions of program and hole removal phases may be implemented. In one form, the number may be in the range of three to ten, at which point a verification operation of the resulting threshold voltage is performed. If the threshold voltage is sufficiently high, the program operation is ended. Other numbers of repetitions may be implemented depending upon the particular application.

It should be noted that the voltage values during the hole removal phase for $V_G$ and $V_D$ are carefully selected. In particular, the values of $V_G$, HR and $V_D$, HR are selected to have a minimal amount of impact ionization such that the hole removal rate to the source is much greater than the hole creation rate from impact ionization during the hole removal phase.

Figure 13:
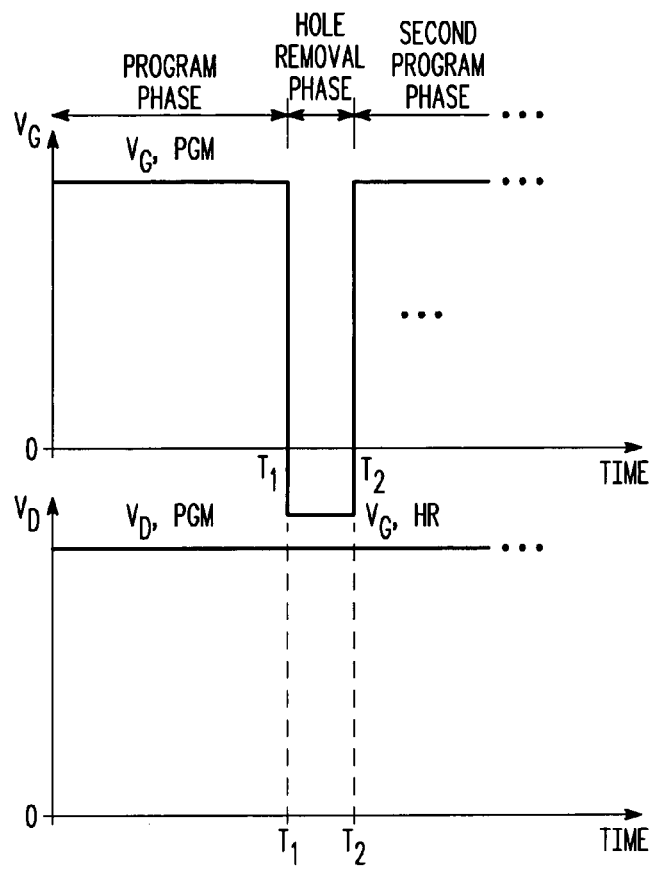
FIG. 13 illustrates in graphical form successive program and hole removal phases of an NVM transistor cell in accordance with another programming embodiment.
Figure 14:
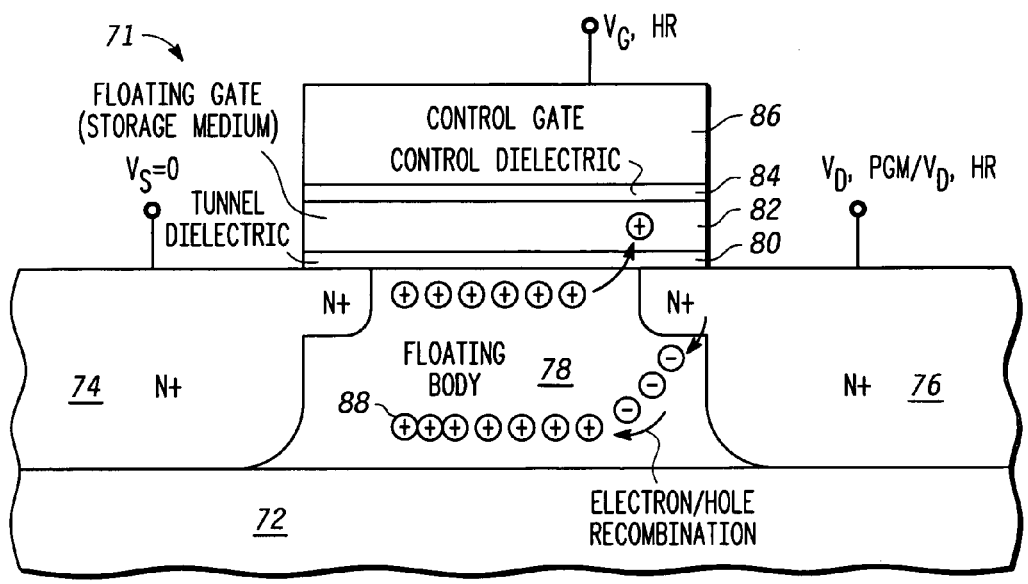
FIG. 14 illustrates in cross-sectional form an NVM transistor cell on SOI for use with the programming embodiment of FIG. 13.

Illustrated in FIG. 13 is yet another programming embodiment which will be explained in combination with the cross-sectional view of NVM transistor 71 of FIG. 14. As before, during a first program phase, a gate program voltage $V_G$, PGM is applied to the control gate 86 while a drain voltage $V_D$, PGM is applied to the drain 76. As before, the program phase lasts a predetermined time which is long enough to begin injection of electrons from the floating body 78 and drain 76 interface region onto the storage medium 82. Holes 88 again begin to build up in the floating body as a result of the impact ionization in the high lateral field region within the interface region between the floating body 78 and the drain 76.

At time T1 the program phase is terminated by changing the value of only the gate voltage and the hole removal phase is entered. During the hole removal phase a $V_G$, HR gate voltage is applied which is negative in value. For example, a $V_G$, HR gate voltage of somewhere in the range of negative two to negative four volts may be applied. However, it should be well understood that other voltage ranges may be implemented. The voltage is chosen to have a value sufficient to inject electrons into the floating body 78 using band to band tunneling at the floating body 78/drain 76 interface region. At the same time a positive drain voltage is continued to be applied to the drain 76. This drain voltage is substantially the same as the immediately preceding drain program voltage $V_D$, PGM. In one form the value of $V_D$, PGM is in the range of four to six volts. It should be similarly understood that other voltage ranges may be implemented. During the hole removal phase, electrons are injected toward the holes 88 resulting from a reverse biasing condition of the drain/body junction together with a negative control gate voltage $V_G$, HR that is sufficient to create band to band tunneling at the drain/floating body interface. As the electrons are injected into the floating body 78, the electrons and holes recombine to remove holes 88 from the floating body 78. Some holes from the band to band tunneling will reside close to the upper surface of the floating body 78 of which some holes may be injected into the storage medium 82. The $V_G$, HR voltage must be selected to minimize this effect while still being able to implement a sufficient amount of hole/electron recombination.

While many holes are removed, it should be understood that not all holes are necessarily removed. However, a significant reduction in the number of holes within the floating body 78 occurs to minimize the threshold voltage variation of NVM transistor 71 and to improve program efficiency. To improve the amount of hole removal, a plurality of successive program phases and hole removal phases may be implemented as indicated in FIG. 13 by the beginning of a second program phase and three dots successive dots. In other words a series of sequential program and hole removal phases may be implemented. Any number of repetitions of program and hole removal phases may be implemented. In one form, the number may be in the range of three to ten, at which point a verification operation of the resulting threshold voltage is performed. If the threshold voltage is sufficiently high, the program operation is ended. Other numbers of repetitions may be implemented depending upon the particular application.

By now it should be appreciated that there has been provided improved nonvolatile programming methods for a nonvolatile memory having a floating body. The various embodiments of these methods may be collectively applied.

Each embodiment efficiently removes holes after the hot carrier phase of a programming operation. As a result, a commercially viable method is disclosed for programming nonvolatile memory cell transistors on SOI. In forms other than SOI, a structure having properties similar to that of partially depleted SOI may be used. The programming methods disclosed herein may be used in stand-alone memories or in memory portions of an integrated circuit having various other functions in addition to memory storage.

In one form there is provided a method of programming a non-volatile memory (NVM) cell having a floating body. During a first programming phase a voltage at a first level is applied to a drain of the NVM cell. A voltage at a second level is applied to a source of the NVM cell, wherein the second level is lower than the first level. A voltage at a third level is applied to a gate of the NVM cell, wherein the third level is greater than the second level. During a second programming phase after the first programming phase, one of the following steps is performed to remove holes in the floating body:

(1) reducing the voltage on the drain to a fourth level, wherein current flows between the source and drain and wherein the fourth level is sufficiently low so as to result in minimal impact ionization; (2) reducing the voltage on the gate to a fifth level, wherein the fifth level is lower than the second level; or (3) reducing the voltage on the drain to a sixth level and reducing the voltage on the gate, wherein the sixth level is below the second level. In one form the second level is ground and the sixth voltage is negative. In another form the first programming phase is of longer duration than the second programming phase. In another form the fourth level is greater than the second level. In yet another form the floating body is P-type silicon, the drain is N-type silicon, and the source is N-type silicon. In another form the NVM cell is a charge storage layer, wherein the storage layer is at least one of polysilicon, nanocrystals (i.e. "nanoclusters") or silicon nitride.

In another form there is provided a method of programming a non-volatile memory (NVM) cell in a floating body. Hot carrier injection is performed on the NVM cell under a first set of electrical bias conditions. Holes that have accumulated in the floating body during the performing of hot carrier injection are actively removed by altering the first set of electrical bias conditions to a second set of electrical bias conditions. In another form the hot carrier injection occurs for a first time duration and the actively removing holes occurs for a second time duration, wherein the second time duration is less than the first time duration. In yet another form the altering of the first set of electrical bias conditions is implemented by changing a voltage on least one of the gate and drain. In another form the changing of the first electrical bias conditions is accomplished by reducing the voltage on the gate and maintaining the voltage on the drain and a voltage on a source of the NVM cell. In yet another form the altering of the first set of electrical bias conditions includes changing the voltage on the drain and the voltage on the gate. In another form the altering of the first set of electrical bias conditions includes changing the voltage on the gate to a level that is less than a level of a voltage on a source of the NVM cell. In yet another form hot carrier injection and active removal of holes is repeated a predetermined number of times after first occurrence of actively removing holes. In another form active removal of holes is repeated each time after repeating the performing of hot carrier injection. In another form the first set of electrical bias conditions is altered by reducing the voltage on the drain and the voltage on the gate. In yet another form the first set of electrical bias conditions is altered by changing the voltage on the drain to be less than a voltage on a source of the NVM cell. In yet another form altering the first set of electrical bias conditions includes reducing the voltage on the drain so as to result in minimal impact ionization. In yet another form the floating body is P-type conductivity and the NVM cell has a source and drain that are N-type conductivity.

In yet another form there is provided a method of programming an NVM cell having a floating body wherein gate and drain signals are applied to the NVM cell having voltage values that cause hot carrier injection into the NVM cell during a first time period. Gate and drain signals are applied to the NVM cell having voltage values that cause hole removal from the floating body during a second time period following the first time period. Gate and drain signals are applied to the NVM cell during a third time period following the second time period that again have voltage values that cause hot carrier injection into the NVM cell. Gate and drain signals are applied to the NVM cell during a fourth time period following the third time period that again have voltage values that cause hole removal from the floating body.

In the foregoing specification, the invention has been described with reference to specific embodiments. However, one of ordinary skill in the art appreciates that various modifications and changes can be made without departing from the scope of the present invention as set forth in the claims below. For example, the memory cell structures may be implemented as standalone nonvolatile memory or as an embedded memory.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method of programming a non-volatile memory (NVM) cell having a floating body, comprising
    during a first programming phase:
        applying a voltage at a first level to a drain of the NVM cell;
        applying a voltage at a second level to a source of the NVM cell, wherein the second level is lower than the first level; and applying a voltage at a third level to a gate of the NVM cell, wherein the third level is greater than the second level; and during a second programming phase after the first programming phase, performing one of the following steps to remove holes in the floating body:

reducing the voltage on the drain to a fourth level, wherein current flows between the source and drain and wherein the fourth level is sufficiently low so as to result in minimal impact ionization;

reducing the voltage on the gate to a fifth level, wherein the fifth level is lower than the second level; or reducing the voltage on the drain to a sixth level and reducing the voltage on the gate, wherein the sixth level is below the second level.

2. The method of claim 1, wherein the second level is ground.

3. The method of claim 1, wherein the sixth level of voltage is negative.

4. The method of claim 1, wherein the first programming phase is of longer duration than the second programming phase.

5. The method of claim 1, wherein the fourth level is greater than the second level.

6. The method of claim 1, wherein the floating body comprises P-type silicon, the drain comprises N-type silicon, and the source comprises N-type silicon.

7. The method of claim 1, wherein the NVM cell comprises a charge storage layer, wherein the charge storage layer comprises at least one of polysilicon, nanoclusters or silicon nitride.

8. A method of programming a non-volatile memory (NVM) cell in a floating body, comprising:

performing hot carrier injection on the NVM cell under a first set of electrical bias conditions; and actively removing holes accumulated in the floating body during the performing hot carrier injection by altering the first set of electrical bias conditions to a second set of electrical bias conditions, wherein the altering the first set of electrical bias conditions comprises changing a voltage on a drain of the NVM cell and a voltage on a gate of the NVM cell.

9. The method of claim 8, wherein the performing hot carrier injection occurs for a first time duration and the actively removing holes occurs for a second time duration, wherein the second time duration is less than the first time duration.

10. The method of claim 8, wherein the altering the first set of electrical bias conditions comprises reducing the voltage on the gate and maintaining the voltage on the drain and a voltage on a source of the NVM cell.

11. The method of claim 8, wherein the altering the first set of electrical bias conditions comprises changing the voltage on the gate to a level that is less than a level of a voltage on a source of the NVM cell.

12. The method of claim 8, further comprising repeating the performing of hot carrier injection after the performing the actively removing holes.

13. The method of claim 8, further comprising repeating the actively removing holes after the repeating the performing of hot carrier injection.

14. The method of claim 8, wherein the altering the first set of electrical bias conditions comprises reducing the voltage on the drain and the voltage on the gate.

15. The method of claim 8, wherein the altering the first set of electrical bias conditions comprises changing the voltage on the drain to be less than a voltage on a source of the NVM cell.

16. The method of claim 8, wherein the altering the first set of electrical bias conditions comprises reducing the voltage on the drain so as to result in minimal impact ionization.

17. The method of claim 8, wherein the floating body is P-type conductivity and wherein the NVM cell comprises a source and a drain that are N-type conductivity.

18. A method of programming a non-volatile memory (NVM) cell in a floating body, comprising:

performing hot carrier injection on the NVM cell under a first set of electrical bias conditions; and actively removing holes accumulated in the floating body during the performing hot carrier injection by altering the first set of electrical bias conditions to a second set of electrical bias conditions, wherein the altering the first set of electrical bias conditions comprises lowering a voltage on a gate of NVM cell and applying a negative voltage to a drain of the NVM cell.

* * * * *